United States Patent
Solhusvik et al.

(10) Patent No.: US 9,406,718 B2
(45) Date of Patent: Aug. 2, 2016

(54) IMAGE SENSOR PIXEL CELL WITH NON-DESTRUCTIVE READOUT

(71) Applicant: OMNIVISION TECHNOLOGIES, INC., Santa Clara, CA (US)

(72) Inventors: Johannes Solhusvik, Haslum (NO); Dominic Massetti, San Jose, CA (US)

(73) Assignee: OmniVision Technologies, Inc., Santa Clara, CA (US)

( * ) Notice: Subject to any disclaimer, the term of this patent is extended or adjusted under 35 U.S.C. 154(b) by 0 days.

(21) Appl. No.: 14/500,193

(22) Filed: Sep. 29, 2014

(65) Prior Publication Data

US 2016/0093664 A1    Mar. 31, 2016

(51) Int. Cl.
*H01L 27/148* (2006.01)
*H01L 27/146* (2006.01)

(52) U.S. Cl.
CPC ...... *H01L 27/14831* (2013.01); *H01L 27/1463* (2013.01); *H01L 27/14603* (2013.01); *H01L 27/14612* (2013.01)

(58) Field of Classification Search
CPC ............ H01L 27/14831; H01L 27/14603; H01L 27/14612; H01L 27/1463
See application file for complete search history.

(56) References Cited

U.S. PATENT DOCUMENTS

| 7,332,703 B2 | 2/2008 | Shah |
| 2006/0180885 A1* | 8/2006 | Rhodes ............. H01L 27/14601 257/432 |
| 2007/0187734 A1 | 8/2007 | Adkisson et al. |
| 2011/0096208 A1 | 4/2011 | Roy et al. |
| 2012/0025199 A1 | 2/2012 | Chen et al. |
| 2012/0080732 A1 | 4/2012 | Anderson et al. |
| 2013/0070131 A1 | 3/2013 | Ohkubo et al. |
| 2014/0327051 A1* | 11/2014 | Ahn ........................ H01L 31/18 257/228 |
| 2015/0048427 A1* | 2/2015 | Hu ..................... H01L 27/14643 257/239 |

FOREIGN PATENT DOCUMENTS

EP    2315251 A1    4/2011

OTHER PUBLICATIONS

EP Patent Application No. 15187189.4—Extended European Search Report, dated Feb. 4, 2016 (5 pages).
TW Patent Application No. 104120195—Taiwanese Office Action and Search Report, dated May 17, 2016, with English Translation, 15 pages.

* cited by examiner

*Primary Examiner* — Whitney T Moore
(74) *Attorney, Agent, or Firm* — Blakely Sokoloff Taylor & Zafman LLP

(57) ABSTRACT

A pixel cell includes a photodiode coupled to photogenerate image charge in response to incident light. A deep trench isolation structure is disposed proximate to the photodiode to provide a capacitive coupling to the photodiode through the deep trench isolation structure. An amplifier transistor is coupled to the deep trench isolation structure to generate amplified image data in response to the image charge read out from the photodiode through the capacitive coupling provided by the deep trench isolation structure. A row select transistor is coupled to an output of the amplifier transistor to selectively output the amplified image data to a column bitline coupled to the row select transistor.

11 Claims, 3 Drawing Sheets

IMAGE SENSOR PIXEL CELL WITH NON-DESTRUCTIVE READOUT

BACKGROUND INFORMATION

1. Field of the Disclosure

The present invention relates generally to image sensors. More specifically, examples of the present invention are related to circuits that readout image data from image sensor pixel cells.

2. Background

Image sensors have become ubiquitous. They are widely used in digital cameras, cellular phones, security cameras, as well as medical, automobile, and other applications. The technology used to manufacture image sensors, and in particular complementary metal-oxide-semiconductor (CMOS) image sensors has continued to advance at great pace. Furthermore, the increasing demands of higher resolution and lower power consumption have encouraged the further miniaturization and integration of these image sensors.

The demands on the image sensor to perform over a large range of lighting conditions, varying from low light conditions to bright light conditions are becoming more difficult to achieve as pixel cells become smaller. This performance capability is generally referred to as having high dynamic range (HDR). In conventional image capture devices with small photosensitive devices, the pixel cells often require multiple successive samples or exposures of the photodiodes with long and short integration times to achieve HDR.

In a conventional CMOS pixel cell, image charge is transferred from a photosensitive device (e.g., a photodiode) and is converted to a voltage signal inside the pixel cell on a floating diffusion node. A challenge with this approach is that each readout of the conventional pixel cell is destructive. In particular, the charges in a photodiode disappear after each readout, which reduces light sensitivity compared to pixel cells that can accumulate light during an entire frame time.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

Figure 1:
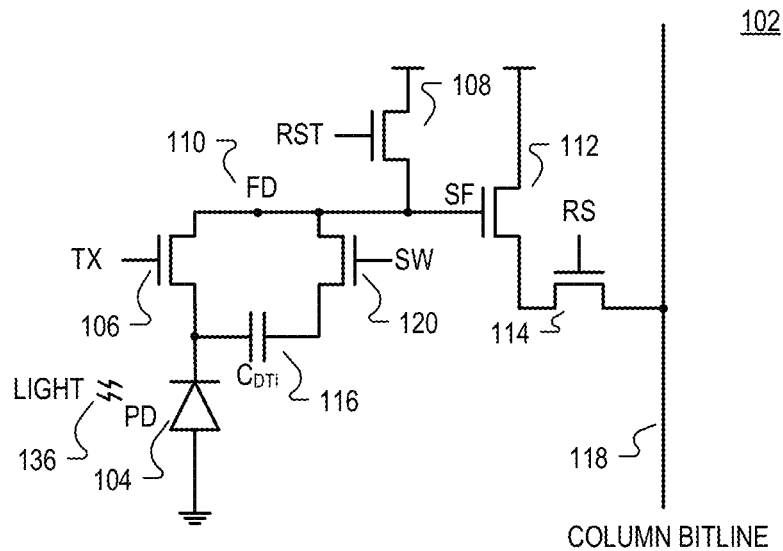
FIG. 1 is a schematic illustrating one example of an image sensor pixel cell including a non-destructive readout in accordance with the teachings of the present invention.

Corresponding reference characters indicate corresponding components throughout the several views of the drawings. Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, common but well-understood elements that are useful or necessary in a commercially feasible embodiment are often not depicted in order to facilitate a less obstructed view of these various embodiments of the present invention.

DETAILED DESCRIPTION

In the following description, numerous specific details are set forth in order to provide a thorough understanding of the present invention. It will be apparent, however, to one having ordinary skill in the art that the specific detail need not be employed to practice the present invention. In other instances, well-known materials or methods have not been described in detail in order to avoid obscuring the present invention.

Reference throughout this specification to "one embodiment", "an embodiment", "one example" or "an example" means that a particular feature, structure or characteristic described in connection with the embodiment or example is included in at least one embodiment of the present invention. Thus, appearances of the phrases "in one embodiment", "in an embodiment", "one example" or "an example" in various places throughout this specification are not necessarily all referring to the same embodiment or example. Furthermore, the particular features, structures or characteristics may be combined in any suitable combinations and/or subcombinations in one or more embodiments or examples. Particular features, structures or characteristics may be included in an integrated circuit, an electronic circuit, a combinational logic circuit, or other suitable components that provide the described functionality. In addition, it is appreciated that the figures provided herewith are for explanation purposes to persons ordinarily skilled in the art and that the drawings are not necessarily drawn to scale.

Examples in accordance with the teaching of the present invention describe examples of image sensor pixel cells having non-destructive readouts in accordance with the teachings of the present invention. As will be shown, in various examples, a capacitive coupling is provided to the photodiode in each pixel cell through which non-destructive readouts of the pixel cell can be performed. For instance, in various examples, deep trench isolation structures are disposed proximate to the photodiodes of each pixel cell in a pixel array to sense voltages in the photodiodes without affecting the accumulated charges in the photodiode. As a result, techniques such as automatic exposure control (AEC) may be provided with the non-destructive readouts of the pixel cell, which therefore improves overall light sensitivity of the pixel cell compared to conventional pixel cells since light can be accumulated during an entire frame time of the pixel cell in accordance with the teachings of the present invention.

To illustrate, FIG. 1 is a schematic illustrating one example of an image sensor pixel cell 102 including a non-destructive readout in accordance with the teachings of the present invention. In the depicted example, the pixel cell 102 includes a photodiode PD 104 coupled to photogenerate image charge in response to incident light 136. A deep trench isolation structure $C_{DTI}$ 116 is disposed proximate to the photodiode PD 104 to provide a capacitive coupling to the photodiode PD 104 through the deep trench isolation structure $C_{DTI}$ 116. In the example schematic depicted in FIG. 1, deep trench isolation structure $C_{DTI}$ 116 is illustrated as a capacitor that is coupled to provide the capacitive coupling to photodiode PD 104.

An amplifier transistor 112 is coupled to the deep trench isolation structure $C_{DTI}$ 116 to generate amplified image data in response to the image charge read out from the photodiode PD 104 through the capacitive coupling provided by the deep trench isolation structure $C_{DTI}$ 116. In the example schematic depicted in FIG. 1, a switch transistor 120 is coupled between the deep trench isolation structure $C_{DTI}$ 116 and a floating diffusion FD 110, which is coupled to an amplifier transistor 112 as shown. In the depicted example, the amplifier transistor 112 is a source follower coupled transistor having its gate terminal selectively coupled to the deep trench isolation structure $C_{DTI}$ 116 through a switch transistor 120. A row select transistor 114 is coupled to an output of the amplifier transistor 112 to selectively output the amplified image data to a column bitline 118 coupled to the row select transistor 114.

As shown in the depicted example, a floating diffusion FD 110 is coupled to the amplifier transistor 112, and a transfer transistor 106 is coupled between the photodiode PD 104 and the floating diffusion FD 110 to selectively couple the floating diffusion FD 110 to the photodiode PD 104. A reset transistor 108 is coupled to the floating diffusion FD 110 to selectively reset charge in the floating diffusion FD 110 and the photodiode PD 104. For instance, in one example, the charge in floating diffusion FD 110 may be reset to a reset voltage through reset transistor 108, and the charge in photodiode PD 104 may be reset to a reset voltage through reset transistor 108 and transfer transistor 106. In the example schematic illustrated in FIG. 1, the charge in the capacitive coupling provided by deep trench isolation structure $C_{DTI}$ 116 may be reset to a reset voltage through reset transistor 108 and switch transistor 120. In one example, it is appreciated that the reset voltage that is coupled to the deep trench isolation structure $C_{DTI}$ 116 to reset the charge in deep trench isolation structure $C_{DTI}$ 116 may be a different reset voltage than the reset voltage that is coupled to reset the charge in the photodiode PD 104 and/or the floating diffusion PD 110. In one example, the different reset voltages may be switched on the reset supply side before the reset transistor 108 is activated.

Therefore, in one example, sensing of the pixel cell 102 can be performed by first resetting the deep trench isolation structure $C_{DTI}$ 116 to a known potential during the photodiode PD 104 reset just before the start of integration. Next, integration may begin with photodiode PD 104 photogenerating charge in response to incident light 136. In one example, correlated double sampling (CDS) may be performed by first resetting the floating diffusion FD 110 to a reset voltage through reset transistor 108. The charge on floating diffusion FD 110 after the reset may then be sampled (e.g., SHR) from column bitline 118 through amplifier transistor 112 and row select transistor 114. Next, a non-destructive read of the charge that is photogenerated in photodiode PD 104 can then be sampled by closing (i.e., turning ON) the switch transistor 120 to short the floating diffusion FD 110 to the deep trench isolation structure $C_{DTI}$ 116, which will non-destructively sample (e.g., SHS) the image charge that is photogenerated in photodiode PD 104 in response to incident light 136 through the capacitive coupling provided by deep trench isolation structure $C_{DTI}$ 116 in accordance with the teachings of the present invention.

Assuming the sample value of the floating diffusion FD 110 after the reset is SHR, and assuming that the sample of the floating diffusion FD 110 after the switch transistor 120 shorts the floating diffusion FD 110 to the deep trench isolation structure $C_{DTI}$ 116 is SHS, the correlated double sampling (CDS) signal value is SHS-SHR. In one example, it is appreciated that automatic exposure control (AEC) may be realized by monitoring the CDS signal value until a threshold value of charge is photogenerated in photodiode PD 104, at which time the photogenerated image charge in photodiode PD 104 can then be read out through the transfer transistor 106, floating diffusion FD 110, amplifier transistor 112, row select transistor 114, and column bitline 118 in accordance with the teachings of the present invention.

Figure 2:
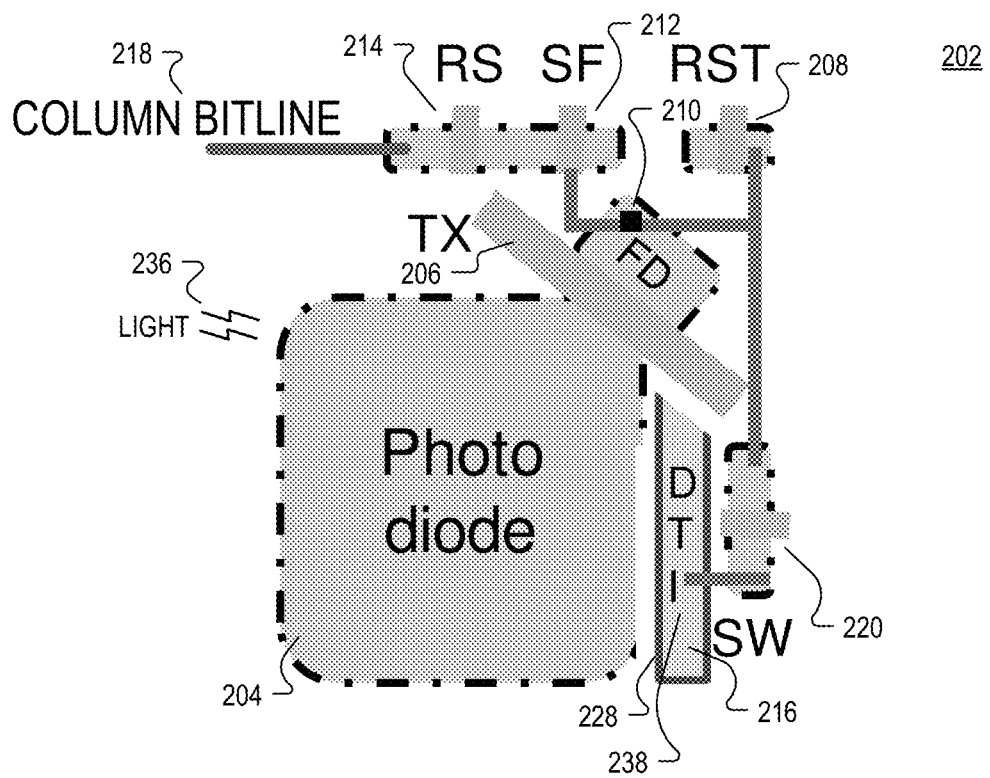
FIG. 2 is a diagram illustrating a layout of an example image sensor pixel cell including a non-destructive readout in accordance with the teachings of the present invention.

FIG. 2 is a diagram illustrating a layout of an example image sensor pixel cell 202 included in a semiconductor chip, with a non-destructive readout in accordance with the teachings of the present invention. It should be appreciated that image sensor pixel cell 202 illustrated in FIG. 2 may be one example of pixel cell 102 shown in FIG. 1, and that similarly named and numbered elements below are coupled and function as described above. As shown in the example, pixel cell 202 includes a photodiode 204 coupled to photogenerate image charge in response to incident light 236. A deep trench isolation structure 216 is disposed proximate to the photodiode 204 to provide a capacitive coupling to the photodiode 204 through the deep trench isolation structure 216.

An amplifier transistor 212 is coupled to the deep trench isolation structure 216 to generate amplified image data in response to the image charge read out from the photodiode 204 through the capacitive coupling provided by the deep trench isolation structure 216. In the example schematic depicted in FIG. 2, a switch transistor 220 is coupled between the deep trench isolation structure 216 and a floating diffusion FD 210, which is coupled to amplifier transistor 212 as shown. In the depicted example, the amplifier transistor 212 is a source follower coupled transistor having its gate terminal selectively coupled to the deep trench isolation structure 216 through the switch transistor 220. A row select transistor 214 is coupled to an output of the amplifier transistor 212 to selectively output the amplified image data to a column bitline 218 coupled to the row select transistor 214.

As shown in the depicted example, floating diffusion FD 210 is coupled to the amplifier transistor 212, and a transfer transistor 206 is coupled between the photodiode 204 and the floating diffusion FD 210 to selectively couple the floating diffusion FD 210 to the photodiode 204. A reset transistor 208 coupled to the floating diffusion FD 210 to selectively reset charge in the floating diffusion FD 210 and the photodiode 204. For instance, in one example, the charge in floating diffusion FD 210 may be reset to a reset voltage through reset transistor 208, and the charge in photodiode 204 may be reset to a reset voltage through reset transistor 208 and transfer transistor 206. In the example schematic illustrated in FIG. 2, the charge in the capacitive coupling provided by deep trench isolation structure 216 may be reset to a reset voltage through reset transistor 208 and switch transistor 220.

In the example depicted in FIG. 2, a conductive material 238, such as for example polysilicon or the like, is disposed within the deep trench isolation structure 216. In the example, an oxide material 228 lines an interior of the deep trench isolation structure 216. In one example, the oxide material 228 lining the interior of the deep trench isolation structure 216 is a charged oxide trench liner. For instance, in one example, oxide material 228 may be a negatively charged oxide trench liner, and in another example, oxide material 228 may be a positively charged oxide liner. As such, it is appreciated that in the illustrated example the capacitance of the capacitive coupling to photodiode 204 provided with deep trench isolation structure 216 is suitably matched to sense the image charge that is accumulated in photodiode 204 in accordance with the teachings of the present invention.

Figure 3:
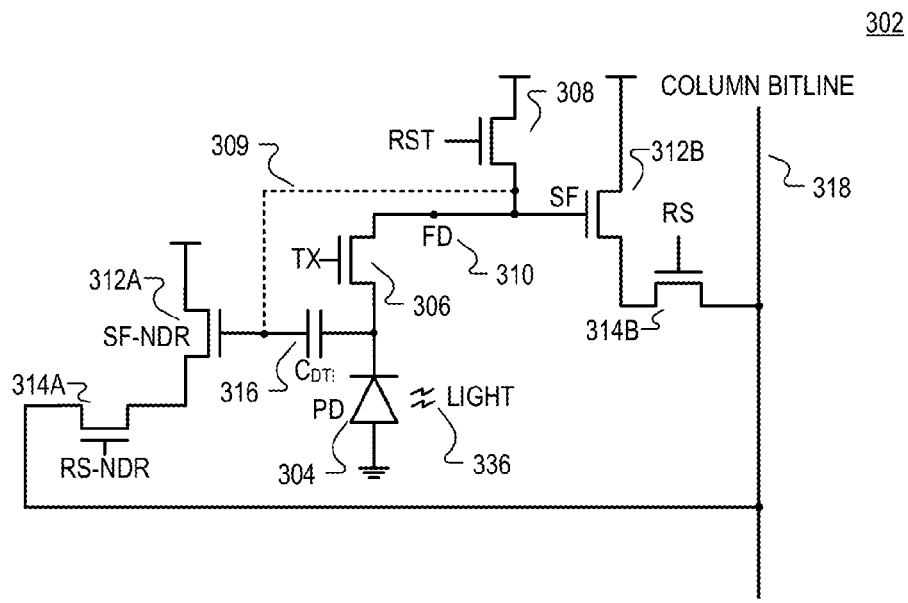
FIG. 3 is a schematic illustrating another example of an image sensor pixel cell including a non-destructive readout in accordance with the teachings of the present invention.

FIG. 3 is a schematic illustrating another example of an image sensor pixel cell 302 including a non-destructive readout in accordance with the teachings of the present invention. It should be appreciated that image sensor pixel cell 302 illustrated in FIG. 3 shares similarities with pixel cell 102 shown in FIG. 1 and/or pixel cell 202 shown in FIG. 2, and that similarly named and numbered elements below are coupled and function as described above. In the depicted example, the pixel cell 302 includes a photodiode PD 304 coupled to photogenerate image charge in response to incident light 336. A deep trench isolation structure $C_{DTI}$ 316 is disposed proximate to the photodiode PD 304 to provide a capacitive coupling to the photodiode PD 304 through the deep trench isolation structure $C_{DTI}$ 316. In the example schematic depicted in FIG. 3, deep trench isolation structure $C_{DTI}$ 316 is illustrated as a capacitor that is coupled to provide the capacitive coupling to photodiode PD 304.

As shown in the illustrated example, a first amplifier transistor 312A is coupled to the deep trench isolation structure $C_{DTI}$ 316 to generate first amplified image data in response to the image charge read out from the photodiode PD 304 through the capacitive coupling provided by the deep trench isolation structure $C_{DTI}$ 316. A first row select transistor 314A is coupled to an output of the first amplifier transistor 312A to selectively output the first amplified image data to a column bitline 318 coupled to the first row select transistor 314A.

In the depicted example, the first amplifier transistor 312A is a source follower coupled transistor having its gate terminal coupled to the deep trench isolation structure $C_{DTI}$ 316 to provide non-destructive readouts of the image charge in photodiode PD 304. In the example, the first row select transistor 314A is coupled to selectively output the non-destructive readouts from the first amplifier transistor 312A to the column bitline 318 in accordance with the teachings of the present invention. Thus, it is appreciated that first amplifier transistor 312A and first row select transistor 314A are used for non-destructive readouts of pixel cell 302.

In one example, pixel cell 302 further includes a second amplifier transistor 312B and a floating diffusion FD 310, which are coupled to generate second amplified image data in response to the image charge read out from the photodiode PD 304 through the floating diffusion FD 310. In the example, a second row select transistor 314B is coupled to an output of the second amplifier transistor 312B to selectively output the second amplified image data to the column bitline 318 coupled to the second row select transistor 314B in accordance with the teachings of the present invention.

As shown in the example depicted in FIG. 3, floating diffusion FD 310 is coupled to the second amplifier transistor 312B, and a transfer transistor 306 is coupled between the photodiode PD 304 and the floating diffusion FD 310 to selectively couple the floating diffusion FD 310 to the photodiode PD 304. A reset transistor 308 is coupled to the floating diffusion FD 310 to selectively reset charge in the floating diffusion FD 310 and the photodiode PD 304. For instance, in one example, the charge in floating diffusion FD 310 may be reset to a reset voltage through reset transistor 308, and the charge in photodiode PD 304 may be reset to a reset voltage through reset transistor 308 and transfer transistor 306. In one example, pixel cell 302 further includes an optional reset connection 309 through which the charge in the capacitive coupling provided by deep trench isolation structure $C_{DTI}$ 316 may also be reset to a reset voltage through reset transistor 308. In one example, it is appreciated that the reset voltage that is coupled to the deep trench isolation structure $C_{DTI}$ 316 through the optional reset connection 309 to reset the charge in deep trench isolation structure $C_{DTI}$ 316 may be a different reset voltage than the reset voltage that is coupled to reset the charge in the photodiode PD 304 and/or the floating diffusion PD 310. In one example, the different reset voltages may be switched on the reset supply side before the reset transistor 308 is activated.

Similar to the examples described in detail above, the image charge accumulated in photodiode PD 304 can be monitored with non-destructive readouts through the capacitive coupling provided with deep trench isolation structure $C_{DTI}$ 316, first amplifier transistor 312A, first row select transistor 314A, and column bitline 318. In one example, it is appreciated that automatic exposure control (AEC) may be realized by monitoring signal values sampled from the photodiode PD 304 through the non-destructive readouts until a threshold value of charge is photogenerated in photodiode PD 304, at which time the photogenerated image charge may then be read out through the transfer transistor 306, floating diffusion FD 310, second amplifier transistor 312B, second row select transistor 314B, and column bitline 318 in accordance with the teachings of the present invention.

Figure 4:
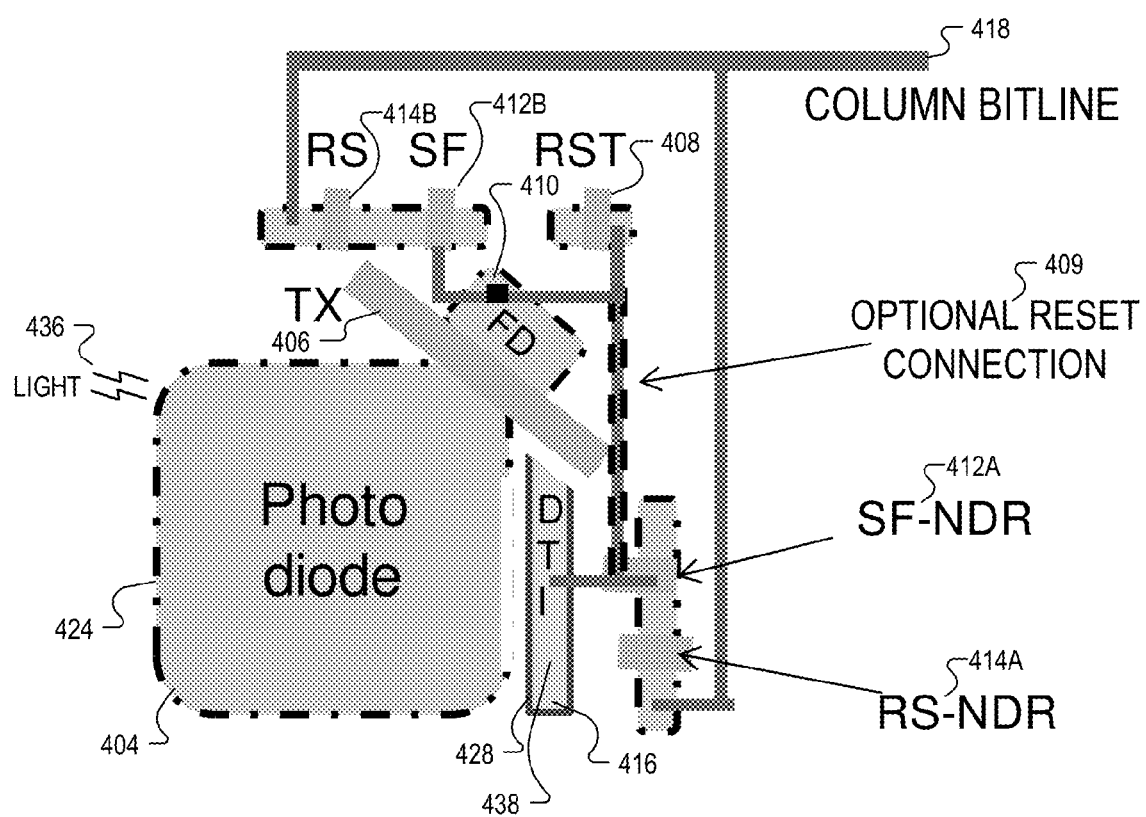
FIG. 4 is a diagram illustrating a layout of another example image sensor pixel cell including a non-destructive readout in accordance with the teachings of the present invention.

FIG. 4 is a diagram illustrating a layout of another example image sensor pixel cell 402 included in a semiconductor chip, with a non-destructive readout in accordance with the teachings of the present invention. It should be appreciated that image sensor pixel cell 402 illustrated in FIG. 4 shares similarities with pixel cell 102 shown in FIG. 1, pixel cell 202 shown in FIG. 2, and/or pixel cell 302 shown in FIG. 3, and that similarly named and numbered elements below are coupled and function as described above. As shown in the example, pixel cell 402 includes a photodiode 404 coupled to photogenerate image charge in response to incident light 436. A deep trench isolation structure 416 is disposed proximate to the photodiode 404 to provide a capacitive coupling to the photodiode 404 through the deep trench isolation structure 416.

A first amplifier transistor 412A is coupled to the deep trench isolation structure 416 to generate first amplified image data in response to the image charge read out from the photodiode 404 through the capacitive coupling provided by the deep trench isolation structure 416. In the depicted example, the first amplifier transistor 412A is a source follower coupled transistor having its gate terminal coupled to the deep trench isolation structure 416. A first row select transistor 414A is coupled to an output of the first amplifier transistor 412A to selectively output the first amplified image data to a column bitline 418 coupled to the first row select transistor 414A.

As shown in the depicted example, a floating diffusion FD 410 is coupled to a second amplifier transistor 412B, and a transfer transistor 406 is coupled between the photodiode 404 and the floating diffusion FD 410 to selectively couple the floating diffusion FD 410 to the photodiode 404. A reset transistor 408 is coupled to the floating diffusion FD 410 to selectively reset charge in the floating diffusion FD 410 and the photodiode 404. For instance, in one example, the charge in floating diffusion FD 410 may be reset to a reset voltage through reset transistor 408, and the charge in photodiode 404 may be reset to a reset voltage through reset transistor 408 and transfer transistor 406. In one example, pixel cell 402 further includes an optional reset connection 409 through which the charge in the capacitive coupling provided by deep trench isolation structure 416 may also be reset to a reset voltage through reset transistor 408.

In the example depicted in FIG. 4, a conductive material 438, such as for example polysilicon or the like, is disposed within the deep trench isolation structure 416. In the example, an oxide material 428 lines an interior of the deep trench isolation structure 416. In one example, the oxide material 428 lining the interior of the deep trench isolation structure 416 is a charged oxide trench liner. For instance, in one example, oxide material 228 may be a negatively charged oxide trench liner, and in another example, oxide material 228 may be a positively charged oxide liner. As such, it is appreciated that in the illustrated example, the capacitance of the capacitive coupling to photodiode 404 provided with deep trench isolation structure 416 is suitably matched to sense the image charge that is accumulated in photodiode 404 in accordance with the teachings of the present invention.

Figure 5:
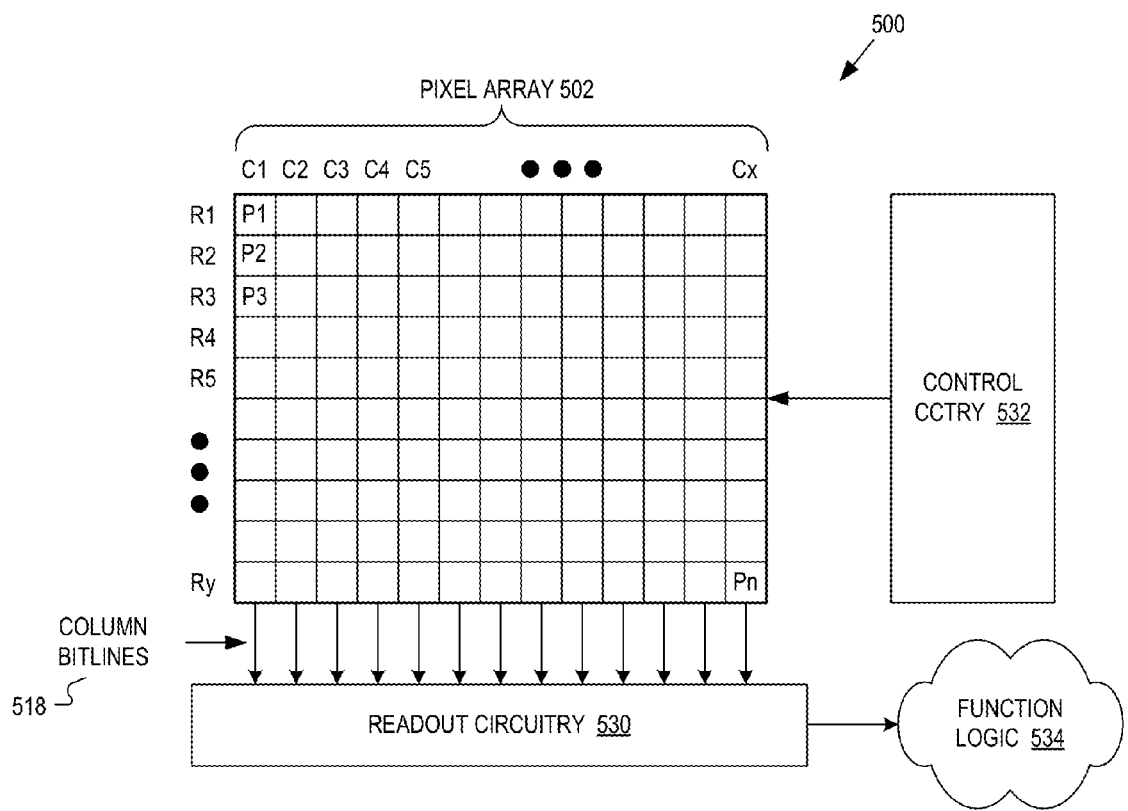
FIG. 5 is a block diagram illustrating an example imaging system including a pixel array having pixel cells with non-destructive readouts in accordance with the teachings of the present invention.

FIG. 5 is a block diagram illustrating an example imaging system 500 including a pixel array having pixel cells with non-destructive readouts in accordance with the teachings of the present invention. As shown in the depicted example, imaging system 500 includes pixel array 502 coupled to control circuitry 532 and readout circuitry 530, which is coupled to function logic 534.

In one example, pixel array 502 is a two-dimensional (2D) array of imaging sensors or pixel cells (e.g., pixel cells P1, P2, . . . , Pn). In one example, each pixel cell is a CMOS imaging pixel. It is noted that the pixel cells P1, P2, . . . Pn in the pixel array 502 may be examples of pixel cell 102 of FIG. 1, pixel cell 202 of FIG. 2, pixel cell 302 of FIG. 3, or pixel cell 402 of FIG. 4, and that similarly named and numbered elements referenced below are coupled and function similar to as described above. As illustrated, each pixel cell is arranged into a row (e.g., rows R1 to Ry) and a column (e.g., column C1 to Cx) to acquire image data of a person, place, object, etc., which can then be used to render a 2D image of the person, place, object, etc.

In one example, after each pixel cell has accumulated its image data or image charge, the image data is readout by readout circuitry 530 through column bitlines 518 and then transferred to function logic 534. In various examples, readout circuitry 530 may also include additional amplification circuitry, additional analog-to-digital (ADC) conversion circuitry, or otherwise. Function logic 534 may simply store the image data or even manipulate the image data by applying post image effects (e.g., crop, rotate, remove red eye, adjust brightness, adjust contrast, or otherwise). In one example, readout circuitry 530 may readout a row of image data at a time along readout column bitlines 518 (illustrated) or may readout the image data using a variety of other techniques (not illustrated), such as a serial readout or a full parallel readout of all pixels simultaneously.

In one example, control circuitry 532 is coupled to pixel array 502 to control operational characteristics of pixel array 502. For example, control circuitry 532 may generate a shutter signal for controlling image acquisition. In one example, the shutter signal is a global shutter signal for simultaneously enabling all pixels within pixel array 502 to simultaneously capture their respective image data during a single acquisition window. In another example, the shutter signal is a rolling shutter signal such that each row, column, or group of pixels is sequentially enabled during consecutive acquisition windows.

The above description of illustrated examples of the present invention, including what is described in the Abstract, are not intended to be exhaustive or to be limitation to the precise forms disclosed. While specific embodiments of, and examples for, the invention are described herein for illustrative purposes, various equivalent modifications are possible without departing from the broader spirit and scope of the present invention.

These modifications can be made to examples of the invention in light of the above detailed description. The terms used in the following claims should not be construed to limit the invention to the specific embodiments disclosed in the specification and the claims. Rather, the scope is to be determined entirely by the following claims, which are to be construed in accordance with established doctrines of claim interpretation. The present specification and figures are accordingly to be regarded as illustrative rather than restrictive.

What is claimed is:

1. A pixel cell, comprising:
a photodiode coupled to photogenerate image charge in response to incident light;
a deep trench isolation structure disposed proximate to the photodiode to provide a capacitive coupling to the photodiode through the deep trench isolation structure, wherein the deep trench isolation structure includes a conductive material, and an oxide material lining an interior of the deep trench isolation structure;
an amplifier transistor coupled to the deep trench isolation structure to generate amplified image data in response to the image charge read out from the photodiode through the capacitive coupling provided by the deep trench isolation structure;
a row select transistor coupled to an output of the amplifier transistor to selectively output the amplified image data to a column bitline coupled to the row select transistor;
a floating diffusion coupled to the amplifier transistor;
a transfer transistor coupled between the photodiode and the floating diffusion to selectively couple the floating diffusion to the photodiode;
a reset transistor coupled to the floating diffusion to selectively reset charge in the floating diffusion and the photodiode; and
a switch transistor coupled between the deep trench isolation structure and the floating diffusion, wherein the amplifier transistor and the reset transistor are selectively coupled to the deep trench isolation structure through the switch transistor.

2. The pixel cell of claim 1 wherein the amplifier transistor is a first amplifier transistor, wherein the row select transistor is a first row select transistor, and wherein the amplified image data selectively output by the first row select transistor is first amplified image data, the pixel cell further comprising: a second amplifier transistor coupled to the floating diffusion to generate second amplified image data in response to the image charge read out from the photodiode through the floating diffusion; and a second row select transistor coupled to an output of the second amplifier transistor to selectively output the second amplified image data to the column bitline coupled to the second row select transistor.

3. The pixel cell of claim 2 wherein the reset transistor is further coupled to the deep trench isolation structure to selectively reset charge in the deep trench isolation structure.

4. The pixel cell of claim 1 wherein the conductive material comprises polysilicon.

5. The pixel cell of claim 4 wherein the oxide material is a charged oxide trench liner.

6. An imaging system, comprising:
a pixel array including a plurality of pixel cells, wherein each one of the pixel cells includes:
a photodiode coupled to photogenerate image charge in response to incident light;
a deep trench isolation structure disposed proximate to the photodiode to provide a capacitive coupling to the photodiode through the deep trench isolation structure, wherein the deep trench isolation structure includes a conductive material, and an oxide material lining an interior of the deep trench isolation structure;
an amplifier transistor coupled to the deep trench isolation structure to generate amplified image data in response to the image charge read out from the photodiode through the capacitive coupling provided by the deep trench isolation structure;

a row select transistor coupled to an output of the amplifier transistor to selectively output the amplified image data to a column bitline coupled to the row select transistor;

a floating diffusion coupled to the amplifier transistor;

a transfer transistor coupled between the photodiode and the floating diffusion to selectively couple the floating diffusion to the photodiode;

a reset transistor coupled to the floating diffusion to selectively reset charge in the floating diffusion and the photodiode; and a switch transistor coupled between the deep trench isolation structure and the floating diffusion, wherein the amplifier transistor and the reset transistor are selectively coupled to the deep trench isolation structure through the switch transistor;

control circuitry coupled to the pixel array to control operation of the pixel array; and readout circuitry coupled to the pixel array to read out the amplified image data from each one of the plurality of pixel cells of the pixel array.

7. The imaging system of claim 6 further comprising function logic coupled to the readout circuitry to store the amplified image data read out from the pixel array.

8. The imaging system of claim 6 wherein the amplifier transistor is a first amplifier transistor, wherein the row select transistor is a first row select transistor, and wherein the amplified image data selectively output by the first row select transistor is first amplified image data, wherein each one of the pixel cells further comprises: a second amplifier transistor coupled to the floating diffusion to generate second amplified image data in response to the image charge read out from the photodiode through the floating diffusion; and a second row select transistor coupled to an output of the second amplifier transistor to selectively output the second amplified image data to the column bitline coupled to the second row select transistor.

9. The imaging system of claim 8 wherein the reset transistor is further coupled to the deep trench isolation structure to selectively reset charge in the deep trench isolation structure.

10. The imaging system of claim 6 wherein the conductive material comprises polysilicon.

11. The imaging system of claim 10 wherein the oxide material is a charged oxide trench liner.

* * * * *